(12) United States Patent
Xu

(10) Patent No.: US 11,581,803 B2
(45) Date of Patent: Feb. 14, 2023

(54) DRIVING CIRCUIT WITH EMI REDUCTION

(71) Applicant: Chengdu Monolithic Power Systems Co., Ltd., Chengdu (CN)

(72) Inventor: Shanglin Xu, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 17/231,714

(22) Filed: Apr. 15, 2021

(65) Prior Publication Data
US 2021/0328504 A1    Oct. 21, 2021

(30) Foreign Application Priority Data

Apr. 20, 2020  (CN) .......................... 202010315382.2

(51) Int. Cl.
*H02M 1/08* (2006.01)
*H02M 1/44* (2007.01)
*H03K 17/16* (2006.01)

(52) U.S. Cl.
CPC ............... *H02M 1/44* (2013.01); *H02M 1/08* (2013.01); *H03K 17/162* (2013.01)

(58) Field of Classification Search
CPC ............ H02M 1/08; H02M 1/44; H02M 1/29; H02M 3/158; H03K 17/162
See application file for complete search history.

(56) References Cited

U.S. PATENT DOCUMENTS

| | | | |
|---|---|---|---|
| 7,808,222 B2 | 10/2010 | Ueunten | |
| 7,882,482 B2 | 2/2011 | Ueunten | |
| 8,080,985 B2 | 12/2011 | Ueunten | |
| 9,236,866 B2* | 1/2016 | Youn | H02M 3/158 |
| 2009/0200996 A1* | 8/2009 | Ojanen | H02M 3/156 |
| | | | 323/234 |
| 2017/0104412 A1* | 4/2017 | Tsai | H02M 3/157 |
| 2018/0076805 A1* | 3/2018 | Paul | H03K 21/02 |

* cited by examiner

*Primary Examiner* — Sibin Chen
(74) *Attorney, Agent, or Firm* — Perkins Coie LLP

(57) ABSTRACT

A driving circuit providing a driving signal at a driving terminal to drive a power switch. The driving signal has a first driving period and a second driving period. Both the first driving period and the second driving period have a first driving time interval. The driving circuit has a first equivalent on resistor established during the first driving time interval and located between a first voltage node and the driving terminal. The first equivalent on resistor has a first equivalent on resistance during the first driving time interval of the first driving period and has a second equivalent on resistance during the first driving time interval of the second driving period. The first equivalent on resistance and the second equivalent on resistance are not equal.

12 Claims, 7 Drawing Sheets

DRIVING CIRCUIT WITH EMI REDUCTION

CROSS-REFERENCE TO RELATED APPLICATIONS

This application claims the benefit of CN application No. 202010315382.2, filed on Apr. 20, 2020 and incorporated herein by reference.

FIELD OF THE INVENTION

The present invention relates generally to a switching mode power supply, and more particularly but not exclusively to the electromagnetic interference (EMI) in the switching mode power supply.

BACKGROUND OF THE INVENTION

In the design of a switching mode power supply, the electromagnetic interference (EMI) issue must be considered. The "frequency jittering" technology is one conventional method to reduce the EMI energy showing up in a narrow frequency range. By periodically or non-periodically changing a driving frequency with which a power switch is driven, the EMI energy will be dispersed to a wider frequency range and the corresponding switching mode power supply can thus meet the EMI standards. However, although the above-mentioned method has a good suppression on the EMI showing up in the low frequency band and in the medium frequency band, it has little suppression on the EMI showing up in the high frequency band. Another conventional method to suppress the EMI is to reduce the driving speed for driving the power switch of the switching mode power supply. By making the rising rate of the rising edge or the falling rate of the falling edge of the driving signal smaller, the high order harmonics EMI energy can be reduced. This method can suppress the EMI generated by the high-order harmonic component, but it will also reduce the efficiency of the switching mode power supply. Especially, there is a risk that the high-side power switch and the low-side power switch in the switching mode power supply may break through if the driving speed is too low.

Thus, there is a need for a switching mode power supply with good EMI suppression, which can at least overcome the above drawbacks.

SUMMARY

Embodiments of the present invention are directed to a driving circuit for driving at least one power switch of a switching mode power supply, wherein the driving circuit has a driving terminal and the driving circuit is configured to provide a driving signal at the driving terminal to control the at least one power switch on and off, and wherein the driving signal has a first driving period and a second driving period with each driving period comprising a first driving time interval and a second driving time interval, the driving circuit comprising: a first equivalent on resistor established during the first driving time interval and located between a first voltage node and the driving terminal; and a second equivalent on resistor established during the second driving time interval and located between the driving terminal and a second voltage node; wherein the first equivalent on resistor has a first equivalent on resistance during the first driving time interval of the first driving period and has a second equivalent on resistance during the first driving time interval of the second driving period, wherein the first equivalent on resistance and the second equivalent on resistance are not equal.

Embodiments of the present invention are also directed to a driving method for driving a power switch of a switching mode power supply, wherein the switching mode power supply is configured to convert a voltage by turning the power switch on and off, the driving method comprising providing a driving signal to control the power switch on and off, wherein the driving signal has a first driving period and a second driving period and the driving signal has a rising edge and a falling edge in both the first driving period and the second driving period, and the rising edge has a first rising transition period and the falling edge has a first falling transition period during the first driving period, the rising edge has a second rising transition period and the falling edge has a second falling transition period during the second driving period, and wherein the first rising transition period is not equal to the second rising transition period, or the first falling transition period is not equal to the second falling transition period.

Embodiments of the present invention are further directed to a driving circuit for driving at least one power switch of a switching mode power supply, wherein the driving circuit has a driving terminal and the driving circuit is configured to provide a driving signal at the driving terminal to control the at least one power switch on and off, the driving circuit comprising: a first driving switch and a second driving switch with each driving switch having a first terminal and a second terminal, wherein the first terminals of the first driving switch and of the second driving switch are both coupled to a first voltage node, the second terminals of the first driving switch and of the second driving switch are both coupled to the driving terminal, and the first driving switch and the second driving switch are turned on and off under the control of a control signal; a third driving switch and a fourth driving switch with each driving switch having a first terminal and a second terminal, wherein the first terminals of the third driving switch and of the fourth driving switch are both coupled to a second voltage node, the second terminals of the third driving switch and of the fourth driving switch are both coupled to the driving terminal, and the third driving switch and the fourth driving switch are turned on and off under the control of the control signal; and a fifth driving switch having a first terminal and a second terminal, wherein the first terminal of the fifth driving switch is coupled to the second terminal of the first driving switch, the second terminal of the fifth driving switch is coupled to the driving terminal, and the fifth driving switch is turned on and off under the control of a first clock signal.

DESCRIPTION OF THE DRAWINGS

The present invention can be further understood with reference to the following detailed description and the appended drawings, wherein like elements are provided with like reference numerals.

DESCRIPTION

Figure 1:
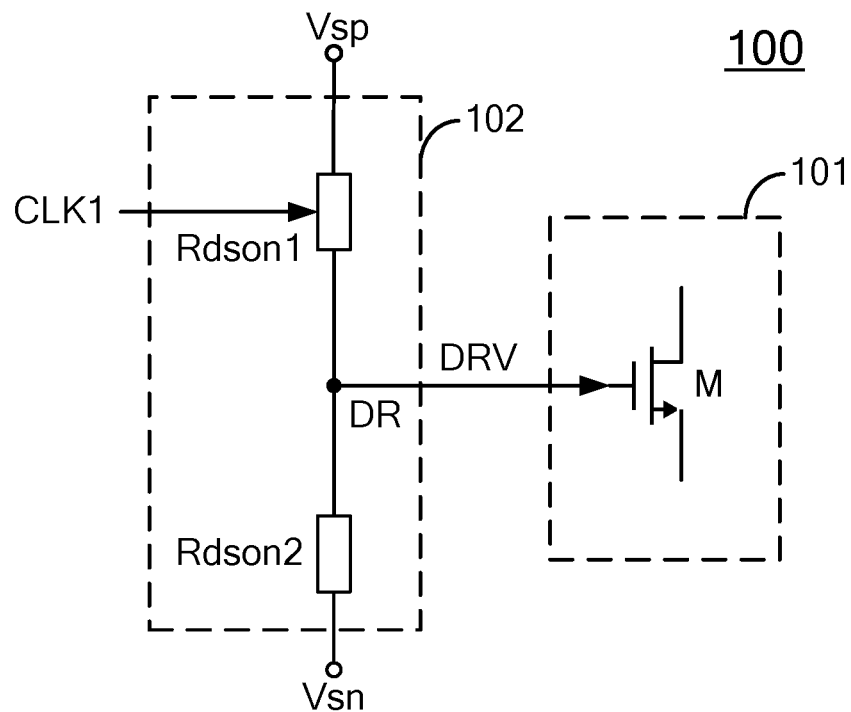
FIG. 1 schematically illustrates a switching mode power supply 100 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the specification, the meaning of "a," "an," and "the" may also comprise plural references.

FIG. 1 schematically illustrates a switching mode power supply 100 in accordance with an embodiment of the present invention. As shown in FIG. 1, the switching mode power supply 100 comprises a switching circuit 101 which comprises a power switch M, and the switching mode power supply 100 converts a voltage by turning the power switch M on and off.

The switching mode power supply 100 further comprises a driving circuit 102 having a driving terminal DR, and the switching mode power supply 100 generates a driving signal DRV at the driving terminal DR and further provides the driving signal DRV to the power switch M to control the on and off switching operations of the power switch M, wherein the driving signal DRV has a driving period and each driving period has a first driving time interval and a second driving time interval. In one embodiment, the driving signal DRV serves to turn the power switch M on and off respectively during the first driving time interval and the second driving time interval, i.e., the driving signal DRV serves to turn on the power switch M during the first driving time interval and to turn off the power switch M during the second driving time interval, or the driving signal DRV serves to turn off the power switch M during the first driving time interval and to turn on the power switch M during the second driving time interval. For example, in one embodiment where the power switch M is implemented with an N-type metal oxide semiconductor field effect transistor (MOSFET), the driving signal DRV serves to turn on the power switch M during the first driving time interval and to turn off the power switch M during the second driving time interval. In another embodiment, the first driving time interval and the second driving time interval form two complementary periods of the driving period.

The driving circuit 102 comprises a first equivalent on resistor Rdson1 and a second equivalent on resistor Rdson2. The first equivalent on resistor Rdson1 is located between a first voltage node Vsp and the driving terminal DR and is established during the first driving time interval. The second equivalent on resistor Rdson2 is located between the driving terminal DR and a second voltage node Vsn and is established during the second driving time interval. The first equivalent on resistor Rdson1 has a first equivalent on resistance Rdson11 during a first driving period T1 of the driving signal DRV and has a second equivalent on resistance Rdson12 during a second driving period T2 of the driving signal DRV, wherein the first equivalent on resistance Rdson11 and the second equivalent on resistance Rdson12 are not equal. In one embodiment, the first driving period T1 and the second driving period T2 may be two adjacent driving periods or two non-adjacent driving periods.

In one embodiment, during the first driving time interval, an electrical path is establish between the first voltage node Vsp and the driving terminal DR so that the first equivalent on resistor Rdson1 is established in this electrical path, while no electrical path is established between the driving terminal DR and the second voltage node Vsn and thus the second equivalent on resistor Rdson2 is not established; during the second driving time interval, an electrical path is established between the driving terminal DR and the second voltage node Vsn so that the second equivalent on resistor Rdson2 is established in this electrical path, while no electrical path is established between the first voltage node Vsp and the driving terminal DR and thus the first equivalent on the resistor Rdson1 is not established. In one embodiment, the establishment of the electrical path between the first voltage node Vsp and the driving terminal DR and the establishment of the electrical path between the driving terminal DR and the second voltage node Vsn are under control of a control signal which has the same cycle and the same phase as the driving signal does.

As shown in FIG. 1, the driving circuit 102 may receive a clock signal CLK1 having a clock period, wherein each clock period comprises a first clock time interval and a second clock time interval. The driving signal DRV has a plurality of driving periods during the first clock time interval and the plurality of driving periods comprise the first driving period T1, and the driving signal DRV also comprises another plurality of driving periods during the second clock time interval and the plurality of driving periods comprise the second driving period T2. In one embodiment, the first clock time interval and the second clock time interval form two complementary periods of the clock period. The clock signal CLK1 operates to control the resistance of the first equivalent on resistor Rdson1 so that the first equivalent on resistor Rdson1 has the first equivalent on resistance Rdson11 during the first clock time interval and has the second equivalent on resistance Rdson12 during the second clock time interval.

As can be known from the operating principle of the switching mode power supply 100, during the first driving time interval, the driving signal DRV transits from a first logic state (e.g., logic low (0)) to a second logic state (e.g., logic high (1)) and the driving signal DRV has a transition period T and a transition frequency f, wherein the transition period T and the transition frequency f are both relevant to the first equivalent on resistor Rdson1. For easy description, in the context of the present invention, the transition period T corresponding to the first equivalent on resistance Rdson11 is represented as a first transition period T1, the transition period T corresponding to the second equivalent on resistance Rdson12 is represented as a second transition period T2, the transition frequency f corresponding to the first equivalent on resistance Rdson11 is represented as a first transition frequency f1 and the transition frequency f corresponding to the second equivalent on resistance Rdson12 is represented as a second transition frequency f2. Then, the first transition period T1 and the second transition period T2 are different, and the first transition frequency f1 and the second transition frequency f2 are different too, since the first equivalent on resistance Rdson11 and the second equivalent on resistance Rdson12 are not equal.

In the prior art, the resistance of the first equivalent on resistor Rdson1 does not change and has the same value in all driving periods. Accordingly, the transition period T for the driving signal DRV to transit from the first logic state (e.g., logic low (0)) to the second logic state (e.g., logic high (1)) does not change and has the same value in all driving periods. Similarly, the transition frequency f for the driving signal DRV to transit from the first logic state (e.g., logic low (0)) to the second logic state (e.g., logic high (1)) does not change and has the same value in all driving periods.

Thus, compared with the prior art, in the switching mode power supply 100 of the present invention, as the transition frequency f for the driving signal DRV to transit from the first logical state to the second logic state varies, the EMI energy introduced by the transition of the driving signal DRV is dispersed to different frequency bands respectively having the transition frequencies f1 and f2 as their central frequencies, as a result, the EMI energy is distributed over a wider frequency range and the spectral density of the EMI energy is greatly reduced, which significantly improves the EMI performance of the switching mode power supply 100.

Figure 2:
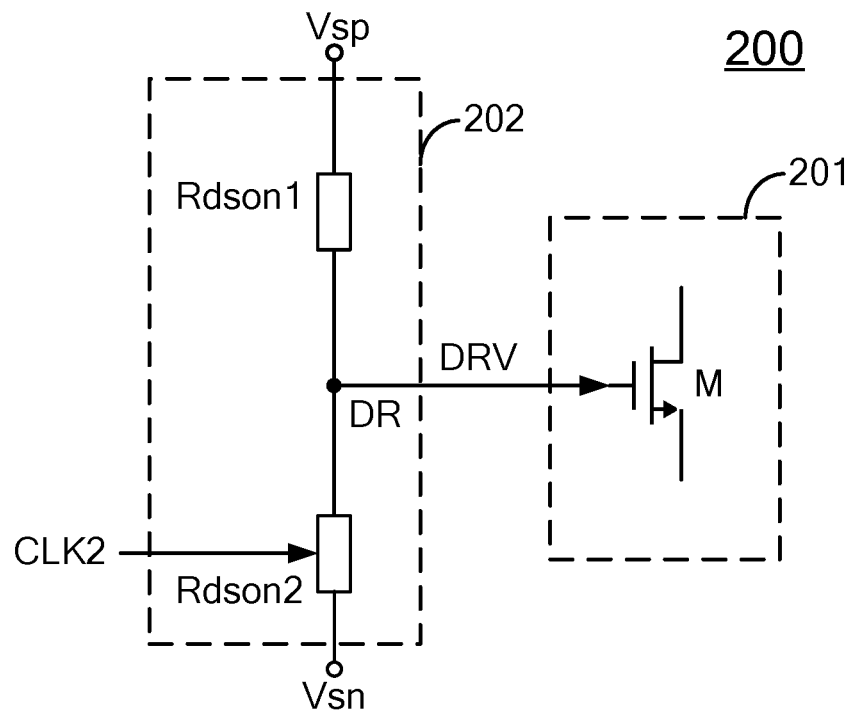
FIG. 2 schematically illustrates a switching mode power supply 200 in accordance with another embodiment of the present invention.

FIG. 2 schematically illustrates a switching mode power supply 200 in accordance with another embodiment of the present invention. The switching mode power supply 200 shown in FIG. 2 has a similar structure as that of the switching mode power supply 100 shown in FIG. 1, except that, in the switching mode power supply 200 shown in FIG. 2, the first equivalent on resistor Rdson1 has the same value in all driving periods of the driving signal DRV, and the second equivalent on resistor Rdson2 has a third equivalent on resistance Rdson21 during the first driving period T1 of the driving signal DRV and has a fourth equivalent on resistance Rdson22 during the second driving period T2 of the driving signal DRV, wherein the third equivalent on resistance Rdson21 and the fourth equivalent on resistance Rdson22 are not equal.

In one embodiment, the driving circuit 202 of the switching mode power supply 200 receives a clock signal CLK2, and the clock signal CLK2 operates to control the resistance of the second equivalent on resistor Rdson2 so that the second equivalent on resistor Rdson2 has the third equivalent on resistance Rdson21 during the first clock time interval and has the fourth equivalent on resistance Rdson22 during the second clock time interval.

As can be known from the operating principle of the switching mode power supply 200, during the second driving time interval, the driving signal DRV transits from the second logic state (e.g., logic high (1)) to the first logic state (e.g., logic low (0)), wherein the transition period T and the transition frequency f are both relevant to the second equivalent on resistor Rdson2. For easy description, in the context of the present invention, the transition period T corresponding to the third equivalent on resistance Rdson21 is represented as a third transition period T3, the transition period T corresponding to the fourth equivalent on resistance Rdson22 is represented as a fourth transition period T4, the transition frequency f corresponding to the third equivalent on resistance Rdson21 is represented as a third transition frequency f3 and the transition frequency f corresponding to the fourth equivalent on resistance Rdson22 is represented as a fourth transition frequency f4. Then, the third transition period T3 and the fourth transition period T4 are different, and the third transition frequency f3 and the fourth transition frequency f4 are different too, since the third equivalent on resistance Rdson21 and the fourth equivalent on resistance Rdson22 are not equal.

Thus, compared with the prior art, in the switching mode power supply 200 of the present invention, as the transition frequency f for the driving signal DRV to transit from the second logical state to the first logic state varies, the EMI energy introduced by the transition of the driving signal DRV is dispersed to different frequency bands respectively having the transition frequencies f3 and f4 as their central frequencies, as a result, the EMI energy is distributed over a wider frequency range and the spectral density of the EMI energy is greatly reduced, which significantly improves the EMI performance of the switching mode power supply 200.

Figure 3:
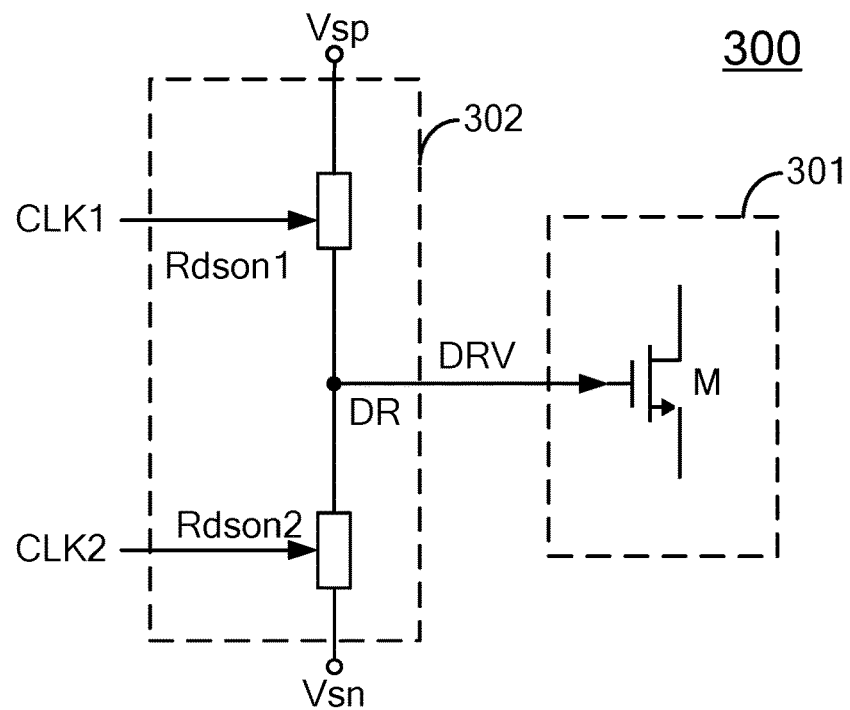
FIG. 3 schematically illustrates a switching mode power supply 300 in accordance with another embodiment of the present invention.

FIG. 3 schematically illustrates a switching mode power supply 300 in accordance with another embodiment of the present invention. The switching mode power supply 300 shown in FIG. 3 has a similar structure as that of the switching mode power supply 100 shown in FIG. 1, except that, in the switching mode power supply 300 shown in FIG. 3, not only the first equivalent on resistance Rdson11 and the second equivalent on resistance Rdson12 are not equal, the third equivalent on resistance Rdson21 and the fourth equivalent on resistance Rdson22 are not equal neither.

In one embodiment, the driving circuit 302 of the switching mode power supply 300 receives not only the clock signal CLK1 but also the clock signal CLK2. The clock signal CLK1 operates to control the resistance of the first equivalent on resistor Rdson1 so that the first equivalent on resistor Rdson1 has the first equivalent on resistance Rdson11 during the first clock time interval and has the second equivalent on resistance Rdson12 during the second clock time interval. The clock signal CLK2 operates to control the resistance of the second equivalent on resistor Rdson2 so that the second equivalent on resistor Rdson2 has the third equivalent on resistance Rdson21 during the first clock time interval and has the fourth equivalent on resistance Rdson22 during the second clock time interval.

Thus, similarly, the first transition frequency f1 and the second transition frequency f2 are different, and the third transition frequency f3 and the fourth transition frequency f4 are different too.

Thus, compared with the prior art, in the switching mode power supply 300 of the present invention, as the transition frequency f of the driving signal DRV varies, the EMI energy introduced by the transition of the driving signal DRV is dispersed to different frequency bands respectively having the transition frequencies f1, f2, f3 and f4 as their central frequencies, as a result, the EMI energy is distributed over a wider frequency range and the spectral density of the EMI energy is greatly reduced, which significantly improves the EMI performance of the switching mode power supply 300.

Figure 4:
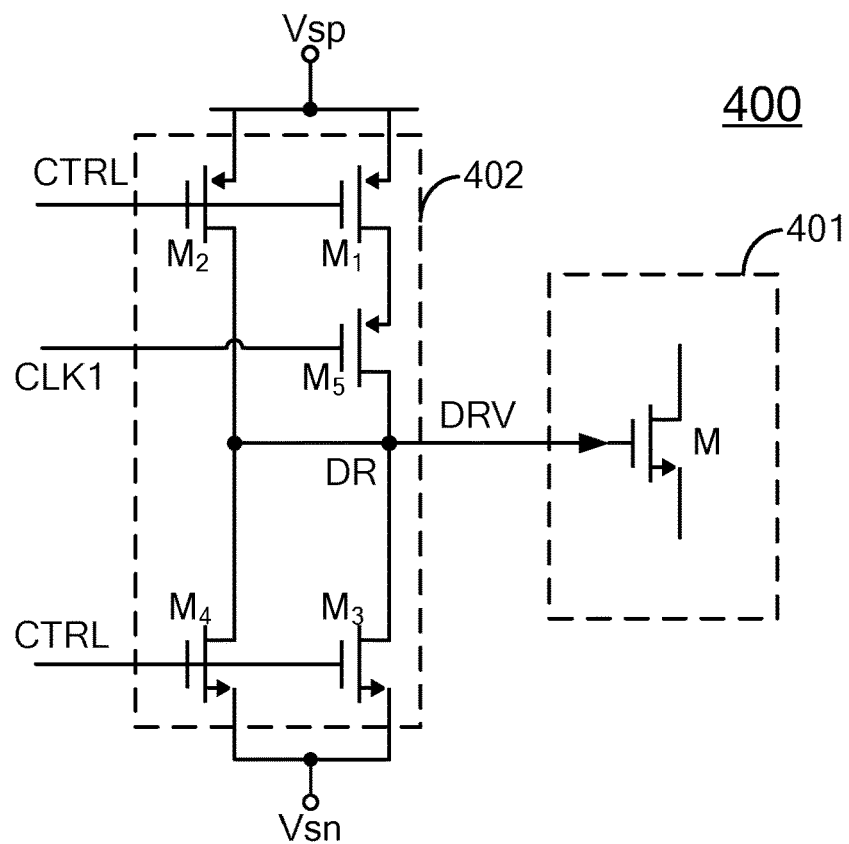
FIG. 4 schematically illustrates a switching mode power supply 400 implemented as the switching mode power supply 100 of FIG. 1 in accordance with an embodiment of the present invention.

FIG. 4 schematically illustrates a switching mode power supply 400 implemented as the switching mode power supply 100 of FIG. 1 in accordance with an embodiment of the present invention. As shown in FIG. 4, the switching mode power supply 400 comprises a switching circuit 401 comprising a power switch M, and the switching mode power supply 400 converts a voltage by turning the power switch M on and off.

The switching mode power supply 400 further comprises a driving circuit 402 having a driving terminal DR, and the switching mode power supply 400 generates a driving signal DRV at the driving terminal DR and further provides the driving signal DRV to the power switch M to control the on and off switching operations of the power switch M. The driving circuit 402 comprises a first driving switch M1, a second driving switch M2, a third driving switch M3 and a fourth driving switch M4, wherein the first driving switch M1, the second driving switch M2, the third driving switch M3 and the fourth driving switch M4 each have a first terminal, a second terminal and a control terminal. The first terminals of the first driving switch M1 and of the second driving switch M2 are both coupled to a first voltage node Vsp, and the second terminals of the first driving switch M1 and of the second driving switch M2 are both coupled to the driving terminal DR. The first terminals of the third driving switch M3 and of the fourth driving switch M4 are both coupled to a second voltage node Vsn, and the second terminals of the third driving switch M3 and of the fourth driving switch M4 are both coupled to the driving terminal DR. The control terminals of the first driving switch M1, the second driving switch M2, the third driving switch M3 and the fourth driving switch M4 are all configured to receive a control signal CTRL, and the first driving switch M1, the second driving switch M2, the third driving switch M3 and the fourth driving switch M4 are turned on and off under the control of the control signal CTRL. The driving circuit 402 further comprises a fifth driving switch M5, wherein the fifth driving switch M5 is coupled between the second terminal of the first driving switch M1 and the driving terminal DR and the fifth driving switch M5 is configured to receive a clock signal CLK1 and is turned on and off under the control of the clock signal CLK1.

In one embodiment, the first driving switch M1, the second driving switch M2 and the fifth driving switch M5 each comprise a P-type metal oxide semiconductor field effect transistor (MOSFET), and the third driving switch M3 and the fourth driving switch M4 each comprise an N-type MOSFET. In another one embodiment, the driving period of the driving signal DRV is smaller than the clock period of the clock signal CLK1. In yet another embodiment, the control signal CTRL and the driving signal DRV have the same frequency and the same phase.

Figure 5:
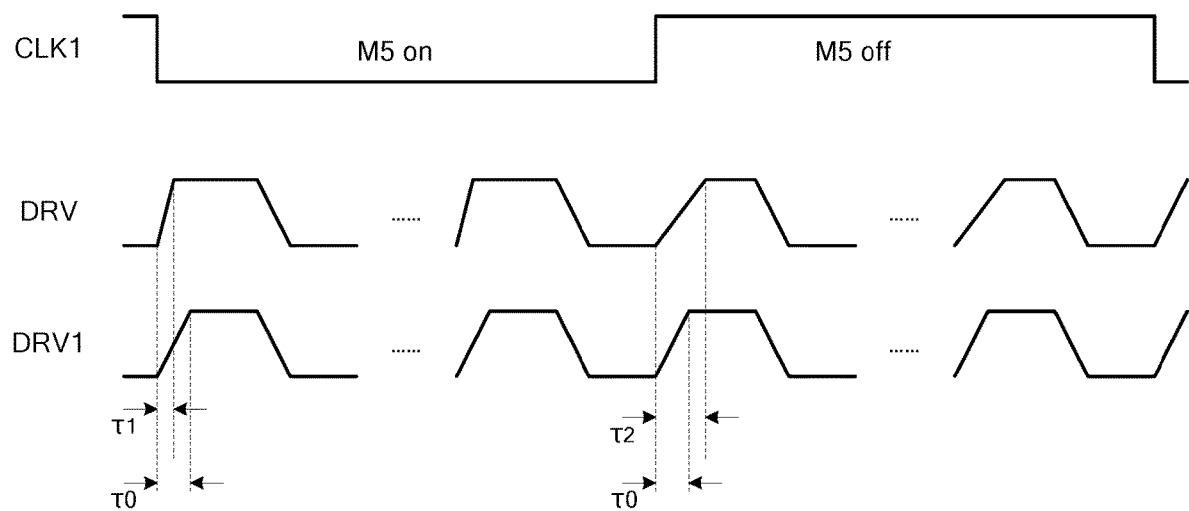
FIG. 5 illustrates some waveforms of the prior-art switching mode power supply and some waveforms of the switching mode power supply 400 shown in FIG. 4.

FIG. 5 illustrates some waveforms of the prior-art switching mode power supply and some waveforms of the switching mode power supply 400 shown in FIG. 4. From top to bottom, FIG. 5 illustrates the clock signal CLK1 and the driving signal DRV of the switching mode power supply 400 shown in FIG. 4 as well as the prior-art driving signal DRV1. Next, the operation of the switching mode power supply 400 will be explained with reference to FIG. 4 and FIG. 5. For the convenience of description, the on resistances of the first driving switch M1, the second driving switch M2, the third driving switch M3, the fourth driving switch M4 and the fifth driving switch M5 are respectively represented as R1~R5.

When the control signal CTRL operates to control the first driving switch M1 and the second driving switch M2 on and to control the third driving switch M3 and the fourth driving switch M4 off, if the clock signal CLK1 operates to turn the fifth driving switch M5 on, for example, when the fifth driving switch M5 is a P-type MOSFET and the clock signal CLK1 is in a logic low (0) state, the first equivalent on resistance Rdson11 of the first equivalent on resistor Rdson1 located between the first voltage node Vsp and the driving terminal DR is determined by the on resistance R1 of the first driving switch M1, the on resistance R2 of the second driving switch M2 and also the on resistance R5 of the fifth driving switch M5, more specifically, the first equivalent on resistance Rdson11 is equal to $$\frac{R2 \times (R1 + R5)}{R1 + R5 + R2};$$

if the clock signal CLK1 operates to turn the fifth driving switch M5 off, for example, the fifth driving switch M5 is a P-type MOSFET and the clock signal CLK1 is in a logic high (1) state, the second equivalent on resistance Rdson21 of the first equivalent on resistor Rdson1 located between the first voltage node Vsp and the driving terminal DR is determined by the on resistance R2 of the second driving switch M2 and is irrelevant to the on resistance R1 of the first driving switch M1 and the on resistance R5 of the fifth driving switch M5, more specifically, the second equivalent on resistance Rdson21 is equal to R2.

As can be known from the operating principle of the switching mode power supply 400, during the first driving time interval, the transition period T for the driving signal DRV to transit from the first logic state (e.g., logic low (0)) to the second logic state (e.g., logic high (1)) is relevant to the equivalent on resistor Rdson1. Thus, when the clock signal CLK1 operates to turn the fifth driving switch M5 on, the transition period T has a first transition period T1 which corresponds to the equivalent on resistance $$\frac{R2 \times (R1 + R5)}{R1 + R5 + R2},$$

and the transition frequency f has a first transition frequency f1 which corresponds to the equivalent on resistance $$\frac{R2 \times (R1 + R5)}{R1 + R5 + R2};$$

while when the clock signal CLK1 operates to turn the fifth driving switch M5 off, the transition period T has a second transition period τ2 which corresponds to the equivalent on resistance R2, and the transition frequency f has a second transition frequency f2 which corresponds to the equivalent on resistance R2.

While in the prior arts, there is no such the fifth driving switch M5 coupled between the first driving switch M1 and the driving terminal DR, thus, the equivalent on resistor Rdson1 located between the first voltage node Vsp and the driving terminal DR is determined by the first driving switch M1 and the second driving switch M2 and is equal to $$\frac{R2 \times R1}{R1 + R2},$$

and both the transition period τ0 and the transition frequency f0 correspond to $$\frac{R2 \times R1}{R1 + R2}$$

and do not change during use.

Thus, compared with the prior art, in the switching mode power supply 400 of the present invention, as the transition frequency f for the driving signal DRV to transit from the first logical state to the second logic state varies, the EMI energy introduced by the transition of the driving signal DRV is dispersed to different frequency bands having the transition frequencies f1 and f2 as their central frequencies, as a result, the EMI energy is distributed over a wider frequency range and the spectral density of the EMI energy is greatly reduced, which significantly improves the EMI performance of the switching mode power supply 400.

Those skilled in the art will recognize that, FIG. 4 illustrates an embodiment for implementing the driving circuit of FIG. 1, however, it is not intended to limit the present invention, the driving circuit of FIG. 1 may be any appropriate circuit implemented by a plurality of driving switches coupled in series, in parallel or in their combination as long as the equivalent on resistances of the first equivalent on resistor in two different driving periods are different in this circuit.

Figure 6:
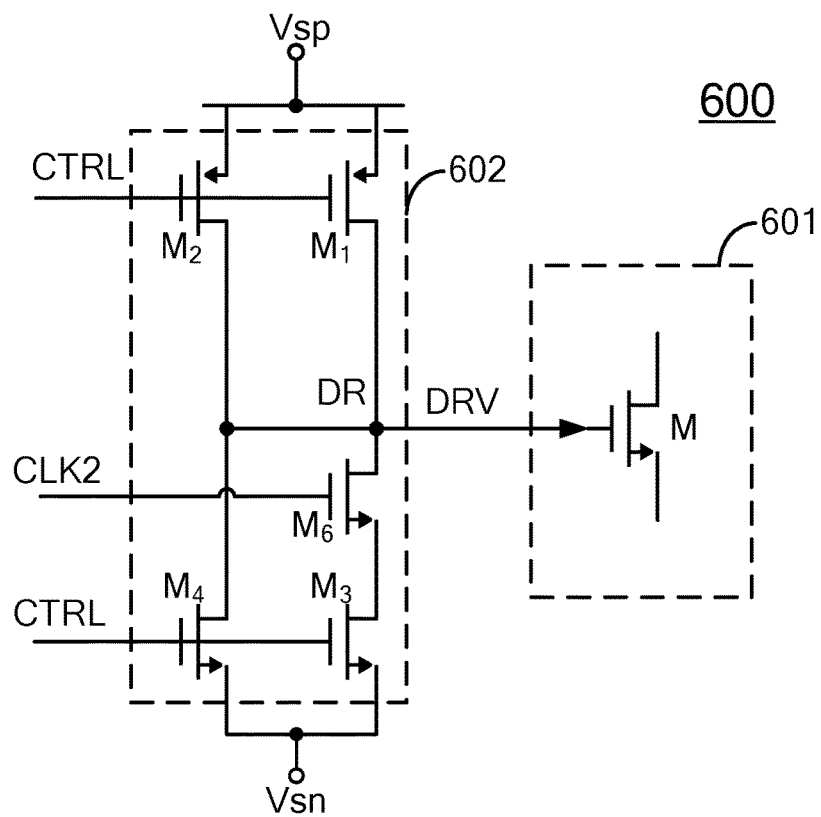
FIG. 6 schematically illustrates a switching mode power supply 600 implemented as the switching mode power supply 200 of FIG. 2 in accordance with an embodiment of the present invention.

FIG. 6 schematically illustrates a switching mode power supply 600 implemented as the switching mode power supply 200 of FIG. 2 in accordance with an embodiment of the present invention. The switching mode power supply 600 of FIG. 6 has a similar structure as that of the switching mode power supply 400 of FIG. 4, except that, in the switching mode power supply 600 of FIG. 6, there is no such the fifth driving switch M5 coupled between the second terminal of the first driving switch M1 and the driving terminal DR, however, there is a sixth driving switch M6 coupled between the second terminal of the third driving switch M3 and the driving terminal DR.

In this way, when the control signal CTRL operates to control the third driving switch M3 and the fourth driving switch M4 on and to control the first driving switch M1 and the second driving switch M2 off, if the clock signal CLK2 operates to turn the sixth driving switch M6 on, for example, when the sixth driving switch M6 is an N-type MOSFET and the clock signal CLK2 is in a logic high (1) state, the third equivalent on resistance Rdson21 of the second equivalent on resistor Rdson2 located between the second voltage node Vsn and the driving terminal DR is determined by the on resistance R3 of the third driving switch M3, the on resis-tance R4 of the fourth driving switch M4 and also the on resistance R6 of the sixth driving switch M6, more specifically, the third equivalent on resistance Rdson21 is equal to $$\frac{R4 \times (R3 + R6)}{R3 + R6 + R4};$$

if the clock signal CLK2 operates to turn the sixth driving switch M6 off, for example, the sixth driving switch M6 is an N-type MOSFET and the clock signal CLK2 is in a logic low (0) state, the fourth equivalent on resistance Rdson22 of the second equivalent on resistor Rdson2 located between the second voltage node Vsn and the driving terminal DR is determined by the on resistance R4 of the fourth driving switch M4 and is irrelevant to the on resistance R3 of the third driving switch M3 and the on resistance R6 of the sixth driving switch M6, more specifically, the fourth equivalent on resistance Rdson22 is equal to R4.

Figure 7:
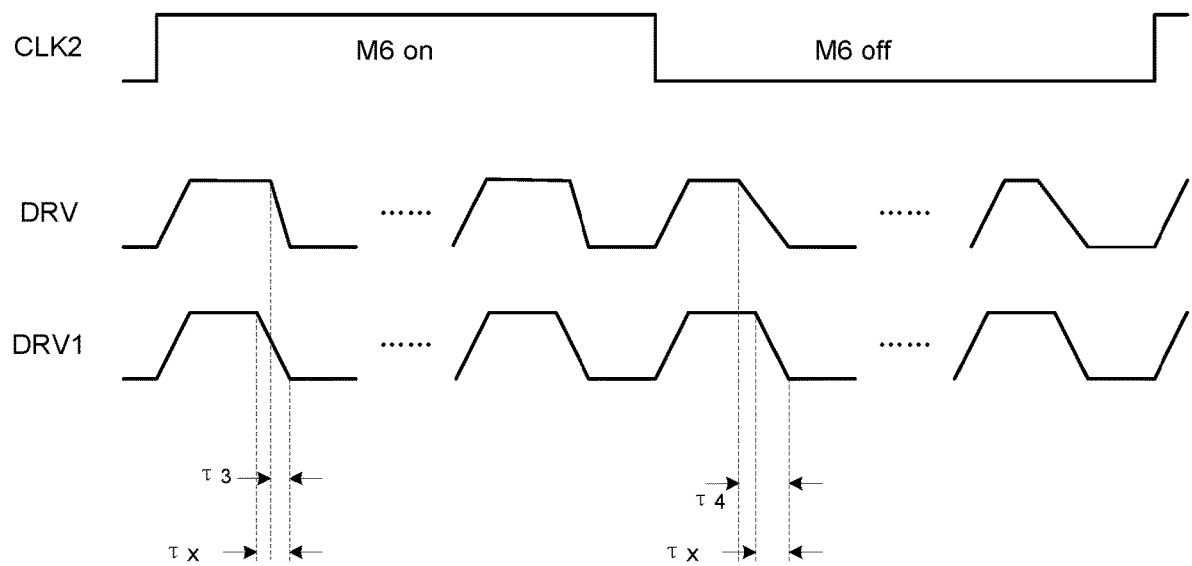
FIG. 7 illustrates some waveforms of the prior-art switching mode power supply and some waveforms of the switching mode power supply 600 shown in FIG. 6.

Accordingly, as shown in FIG. 7, when the clock signal CLK2 operates to turn the sixth driving switch M6 on, the transition period τ has a third transition period τ3 which corresponds to the equivalent on resistance $$\frac{R4 \times (R3 + R6)}{R3 + R6 + R4},$$

and the transition frequency f has a third transition frequency f3 which corresponds to the equivalent on resistance $$\frac{R4 \times (R3 + R6)}{R3 + R6 + R4};$$

while when the clock signal CLK2 operates to turn the sixth driving switch M6 off, the transition period τ has a fourth transition period τ4 which corresponds to the equivalent on resistance R4, and the transition frequency f has a fourth transition frequency f4 which corresponds to the equivalent on resistance R4.

Thus, compared with the prior art, in the switching mode power supply 600 of the present invention, as the transition frequency f of the driving signal DRV varies, the EMI energy introduced by the transition of the driving signal DRV is dispersed to different frequency bands having the transition frequencies f3 and f4 as their central frequencies, as a result, the EMI energy is distributed over a wider frequency range and the spectral density of the EMI energy is greatly reduced, which significantly improves the EMI performance of the switching mode power supply 600.

Those skilled in the art will recognize that, FIG. 6 illustrates an embodiment for implementing the driving circuit of FIG. 2, however, it is not intended to limit the present invention, the driving circuit of FIG. 2 may be any appropriate circuit implemented by a plurality of driving switches coupled in series, in parallel or in their combination as long as the equivalent on resistances of the second equivalent on resistor in two different driving periods are different in this circuit.

Figure 8:
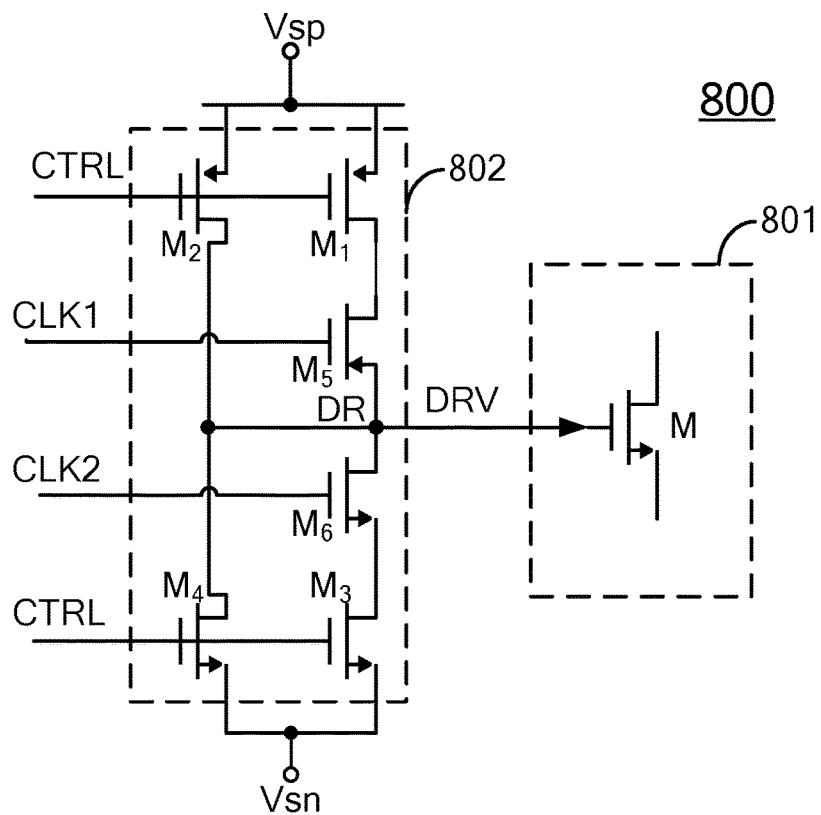
FIG. 8 schematically illustrates a switching mode power supply 800 implemented as the switching mode power supply 300 of FIG. 3 in accordance with an embodiment of the present invention.

FIG. 8 schematically illustrates a switching mode power supply 800 implemented as the switching mode power supply 300 of FIG. 3 in accordance with an embodiment of the present invention. The switching mode power supply 800 of FIG. 8 has a similar structure as that of the switching mode power supply 400 of FIG. 4, except that, in the switching mode power supply 800 of FIG. 8, there is a sixth driving switch M6 coupled between the second terminal of the third driving switch M3 and the driving terminal DR in addition to the fifth driving switch M5 coupled between the second terminal of the first driving switch M1 and the driving terminal DR. In the switching mode power supply 800, the fifth driving switch M5 is turned on and off under the control of the clock signal CLK1, while the sixth driving switch M6 is turned on and off under the control of the clock signal CLK2. In one embodiment, the clock signals CLK1 and CLK2 are the same signal. And in another embodiment, the clock signals CLK1 and CLK2 may be different signals.

Figure 9:
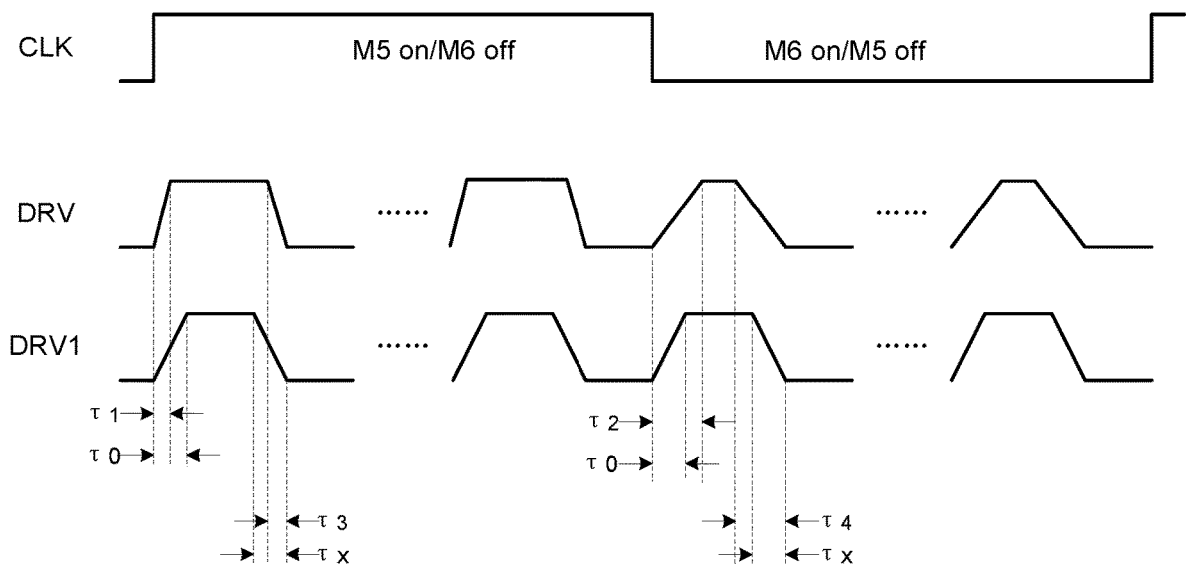
FIG. 9 illustrates some waveforms of the prior-art switching mode power supply and some waveforms of the switching mode power supply 800 shown in FIG. 8.

As can be known from the operating principle of the switching mode power supply 800, as shown in FIG. 9, depending on the state of the clock signal CLK1, the transition frequency f for the driving signal DRV to transit from the first logical state to the second logic state has two different values f1 and f2; similarly, depending on the state of the clock signal CLK2, the transition frequency f for the driving signal DRV to transit from the second logical state to the first logic state has two different values f3 and f4. Thus, the EMI energy introduced by the transition of the driving signal DRV is dispersed to different frequency bands having the transition frequencies f1, f2, f3 and f4 as their central frequencies, as a result, the EMI energy is distributed over a wider frequency range and the spectral density of the EMI energy is greatly reduced, which significantly improves the EMI performance of the switching mode power supply 800.

Those skilled in the art will recognize that, FIG. 8 illustrates an embodiment for implementing the driving circuit of FIG. 3, however, it is not intended to limit the present invention, the driving circuit of FIG. 3 may be any appropriate circuit implemented by a plurality of driving switches coupled in series, in parallel or in their combination as long as the equivalent on resistances of the first equivalent on resistor in two different driving periods are different and the equivalent on resistances of the second equivalent on resistor in two different driving periods are different too in this circuit.

Figure 10:
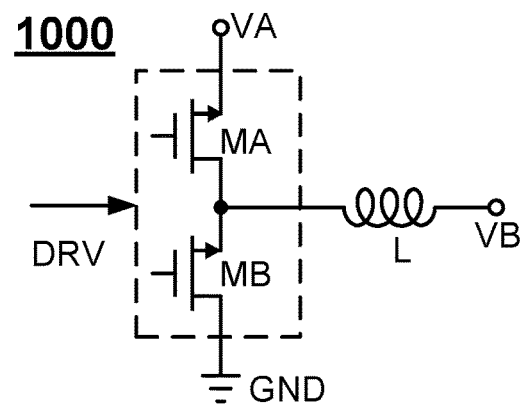
FIG. 10 schematically illustrates a switching circuit 1000 in accordance with an embodiment of the present invention.

FIG. 10 schematically illustrates a switching circuit 1000 in accordance with an embodiment of the present invention. As shown in FIG. 10, the switching circuit 1000 comprises a first power switch MA and a second power switch MB. The first power switch MA and the second power switch MB each have a first terminal, a second terminal and a control terminal. The first terminal of the first power switch MA has a voltage VA, the first terminal of the second power switch MB is coupled to the second terminal of the first power switch MA, the second terminal of the second power switch MB is coupled to a reference ground GND. In one embodiment, the switching mode power supply further comprises an inductor L having a first terminal and a second terminal, wherein the first terminal of the inductor L is coupled to the first terminal of the second power switch MB and the second terminal of the first power switch MA, and the second terminal of the inductor L has a voltage VB. In one embodiment, the switching circuit 1000 has a buck topology to convert the voltage VA into the voltage VB. In another embodiment, the switching circuit 1000 has a boost topology to convert the voltage VB into the voltage VA. In one embodiment, the switching circuit 1000 has a bidirectional converting topology to convert the voltage VA into the voltage VB or to convert the voltage VB into voltage VA depending on which of the voltages VA and VB having a bigger value. Those skilled in the art should understand that the switching mode power supply according to the embodiments of the present invention is not only applicable to the aforementioned buck topology, boost topology, and bidirectional converting topology, but also applicable to any other switching circuit topology with an EMI issue, for example, the flyback topology, the buck-boost topology etc.

In the embodiment illustrated in FIG. 10, the switching circuit 1000 receives a driving signal DRV to control the power switches MA and MB on and off. When the driving signal DRV is generated according to the various embodiments of the present invention to drive the power switch MA, the first voltage node Vsp may be any applicable supply voltage node, for example, it may be an output voltage node of a bootstrap capacitor for outputting a bootstrap voltage or the first terminal of the power switch MA or the like, while the second voltage node Vsn may be the second terminal of the power switch MA; when the driving signal DRV is generated to drive the power switch MB, the first voltage node Vsp may be a power supply voltage node, for example, it may be an output voltage node of an LDO or an external node providing a driving voltage or the like, while the second voltage node Vsn may be the reference ground GND.

Figure 11:
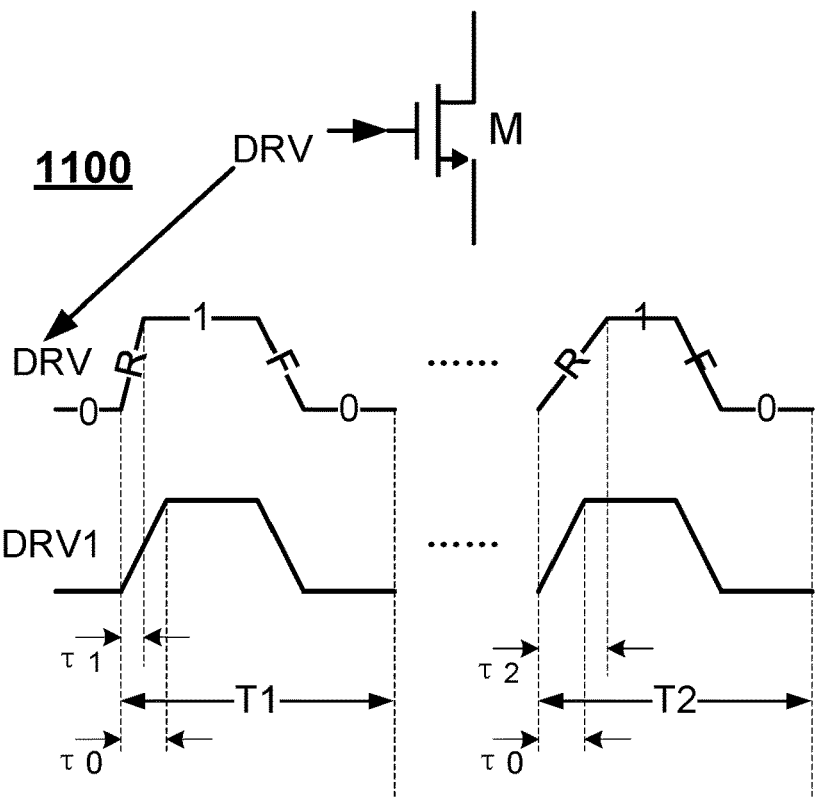
FIG. 11 illustrates a driving method 1100 for driving a power switch M in accordance with an embodiment of the present invention.

FIG. 11 illustrates a driving method 1100 for driving a power switch M in accordance with an embodiment of the present invention. As shown in FIG. 11, the driving method 1100 comprises providing a driving signal DRV to control the power switch M on and off. The power switch M may be a power switch of any switching circuit such as a switching circuit of a buck topology, a boost topology, a bidirectional converting topology shown in FIG. 10 or any other switching circuit topology with an EMI issue (e.g., a flyback topology, a buck-boost topology).

As shown in FIG. 11, the driving signal DRV has a driving period. In each driving period, the driving signal DRV transits from a first logic state (e.g., logic low (0)) to a second logic state (e.g., logic high (1)) and/or from the second logic state (e.g., logic high (1)) to the first logic state (e.g., logic low (0)). Accordingly, the driving signal DRV has a rising edge R when the driving signal DRV transits from the first logic state (e.g., logic low (0)) to the second logic state (e.g., logic high (1)) and the rising time duration of the rising edge R, i.e., the time duration for the driving signal DRV to transit from the first logic state (e.g., logic low (0)) to the second logic state (e.g., logic high (1)) is referred to as a rising transition period; the driving signal DRV has a falling edge F when the driving signal DRV transits from the second logic state (e.g., logic high (1)) to the first logic state (e.g., logic low (0)), and the falling time duration of the falling edge F, i.e., the time duration for the driving signal DRV to transit from the second logic state (e.g., logic high (1)) to the first logic state (e.g., logic low (0)) is referred to as a falling transition period.

With continuing reference to FIG. 11, in the driving method 1100 shown in FIG. 11, the rising transition period of the driving signal DRV in a first driving period T1 is τ1 and the rising transition period of the driving signal DRV in the second driving period T2 is τ2, wherein τ1 and τ2 are not equal. In an embodiment, the first driving period T1 and the second driving period T2 may be two adjacent driving periods or two non-adjacent driving periods.

In one embodiment, the first driving period T1 is within a first clock time interval, the second driving period T2 is within a second clock time interval, the driving signal DRV has a plurality of driving periods during the first clock time interval and has another plurality of driving periods during the second clock time interval, and the rising edge R of the driving signal DRV has the first rising transition period τ1 during the first clock time interval, and has the second rising transition period T2 differing from the first rising transition period T1 during the second clock time interval.

FIG. 11 further illustrates the prior-art driving method using the driving signal DRV1 to drive the power switch M. In the prior-art driving method, the rising edge R of the driving signal DRV1 in any two driving periods has the same rising transition period and the falling edge F of the driving signal DRV1 in any two driving periods has the same falling transition period.

As shown in FIG. 11, compared with the prior art, in the driving method 1100 of the present invention, as the rising transition period T1 of the driving signal DRV is different from the rising transition period T2, the EMI energy introduced by the transition of the driving signal DRV is dispersed to different frequency bands having the transition frequencies respectively corresponding to the rising transition periods T1 and T2 as their central frequencies, as a result, the EMI energy is distributed over a wider frequency range and the spectral density of the EMI energy is greatly reduced, which significantly improves the EMI performance.

Figure 12:
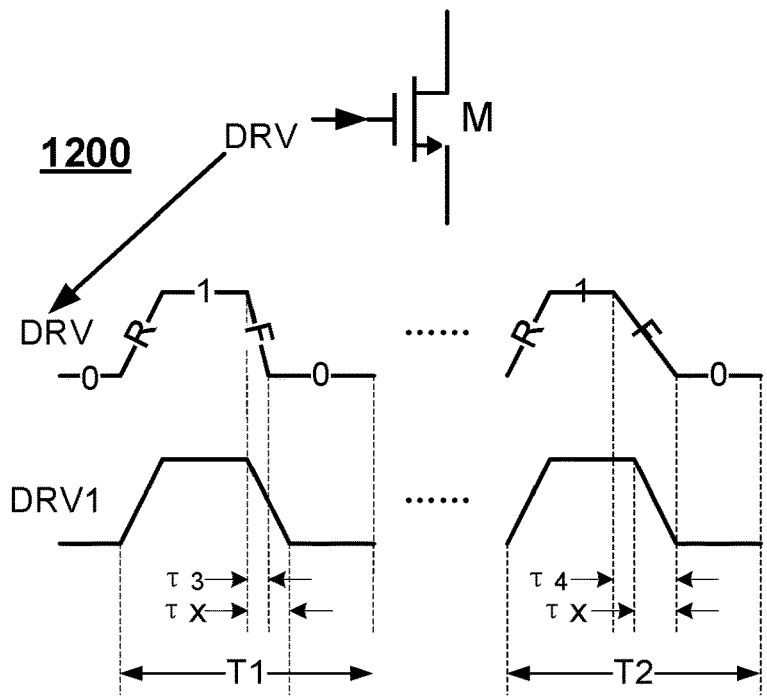
FIG. 12 illustrates a driving method 1200 for driving a power switch M in accordance with an embodiment of the present invention.

FIG. 12 illustrates a driving method 1200 for driving a power switch M in accordance with an embodiment of the present invention. The driving method 1200 is similar to the driving method 1100, except that, the falling transition period of the driving signal DRV in the first driving period T1 is T3, and the falling transition period of the driving signal DRV in the second driving period T2 is T4, wherein T3 and T4 are not equal.

In one embodiment, the first driving period T1 is within the first clock time interval, the second driving period T2 is within the second clock time interval, the driving signal DRV has a plurality of driving periods during the first clock time interval and has another plurality of driving periods during the second clock time interval, and the falling edge F of the driving signal DRV has the falling transition period T3 during the first clock time interval, and has the falling transition period T4 differing from the falling transition period T3 during the second clock time interval.

As shown in FIG. 12, compared with the prior art, in the driving method 1200 of the present invention, as the falling transition period T3 of the driving signal DRV is different from the falling transition period T4, the EMI energy introduced by the transition of the driving signal DRV is dispersed to different frequency bands having the transition frequencies corresponding to the falling transition periods T3 and T4 as their central frequencies, as a result, the EMI energy is distributed over a wider frequency range and the spectral density of the EMI energy is greatly reduced, which significantly improves the EMI performance.

Figure 13:
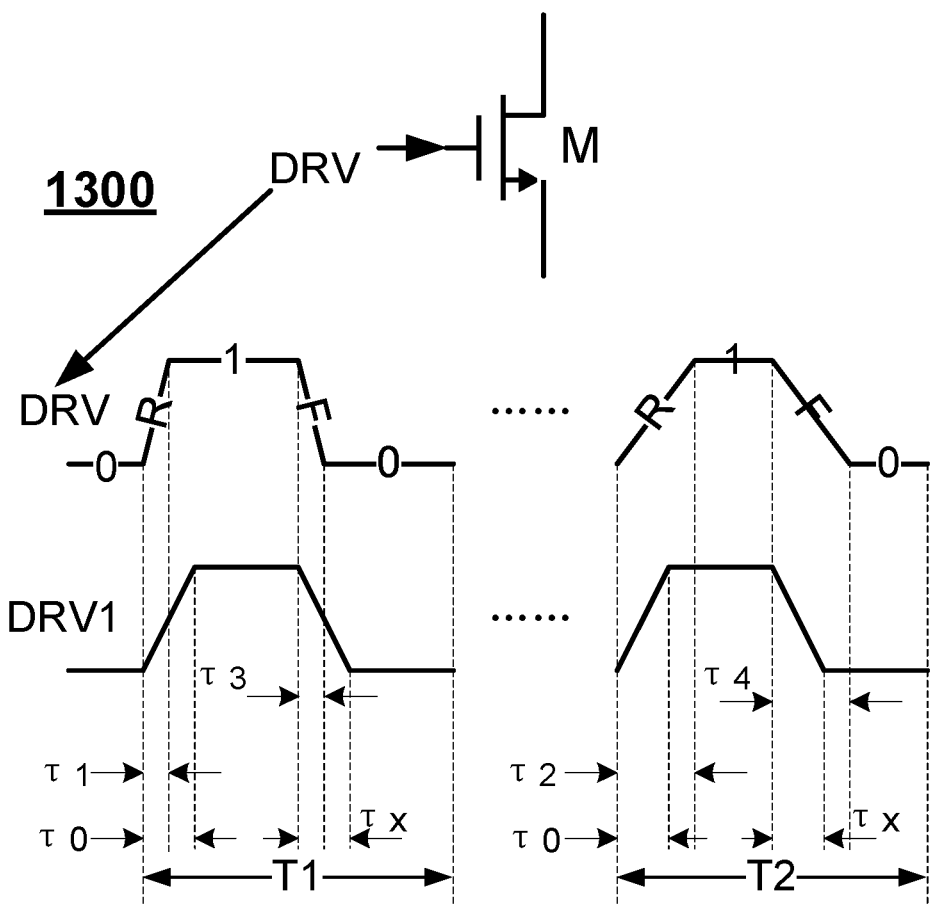
FIG. 13 illustrates a driving method 1300 for driving a power switch M in accordance with an embodiment of the present invention.

FIG. 13 illustrates a driving method 1300 for driving a power switch M in accordance with an embodiment of the present invention. The driving method 1300 is similar to the driving method 1100, except that, in the driving method 1300, not only the rising transition period T3 is different from the rising transition period T4, the falling transition period T3 and the falling transition period T4 are not equal neither.

In one embodiment, the first driving period T1 is within the first clock time interval, the second driving period T2 is within the second clock time interval, the driving signal DRV has a plurality of driving periods during the first clock time interval and has another plurality of driving periods during the second clock time interval, and the rising edge R of the driving signal DRV has the first rising transition period T1 during the first clock time interval and has the second rising transition period T2 differing from the first rising transition period T1 during the second clock time interval, and the falling edge F of the driving signal DRV has the falling transition period T3 during the first clock time interval and has the falling transition period T4 differing from the falling transition period T3 during the second clock time interval.

As shown in FIG. 13, compared with the prior art, in the driving method 1300 of the present invention, as the rising transition period T1 of the driving signal DRV is different from the rising transition period T2 and the falling transition period T3 of the driving signal DRV is different from the falling transition period T4, the EMI energy introduced by the transition of the driving signal DRV is dispersed to different frequency bands respectively having the transition frequencies corresponding to the rising transition periods T1 and T2 and the falling transition periods T3 and T4 as their central frequencies, as a result, the EMI energy is distributed over a wider frequency range and the spectral density of the EMI energy is greatly reduced, which significantly improves the EMI performance.

It will be appreciated by persons skilled in the art that the present invention is not limited to what has been particularly shown and described herein above. Rather the scope of the present invention is defined by the appended claims and comprises both combinations and sub-combinations of the various features described hereinabove as well as variations and modifications thereof which would occur to persons skilled in the art upon reading the foregoing description and which are not in the prior art.

What is claimed is:

1. A driving circuit for driving at least one power switch of a switching mode power supply, wherein the driving circuit has a driving terminal and the driving circuit is configured to provide a driving signal at the driving terminal to control the at least one power switch on and off, and wherein the driving signal has a plurality of driving periods with each driving period comprising a first driving time interval to turn on the at least one power switch and a second driving time interval to turn off the at least one power switch, the driving circuit comprising:
   a first equivalent on resistor established during the first driving time interval and located between a first voltage node and the driving terminal; and
   a second equivalent on resistor established during the second driving time interval and located between the driving terminal and a second voltage node;
   wherein the first equivalent on resistor has a first equivalent on resistance during the first driving time interval of the first driving period and has a second equivalent on resistance during the first driving time interval of the second driving period, wherein the first equivalent on resistance and the second equivalent on resistance are not equal.

2. The driving circuit as claimed in claim 1, wherein the driving circuit receives a first clock signal having a clock period comprising a first clock time interval and a second clock time interval, and the driving signal has a first plurality of driving periods comprising the first driving period during the first clock time interval and has a second plurality of driving periods comprising the second driving period during the second clock time interval, and wherein the first clock signal controls the first equivalent on resistor so that the first equivalent on resistor has the first equivalent on resistance during the first driving time intervals of the first plurality of driving periods and has the second equivalent on resistance during the first driving time intervals of the second plurality of driving periods.

3. The driving circuit as claimed in claim 1, wherein during the first driving time interval, a first electrical path is established between the first voltage node and the driving terminal so as to establish the first equivalent on resistor; during the second driving time interval, a second electrical path is established between the driving terminal and the second voltage node so as to establish the second equivalent on resistor, wherein the first equivalent on resistor and the second equivalent on resistor are not established at the same time.

4. The driving circuit as claimed in claim 1, comprising:
a first driving switch and a second driving switch with each driving switch having a first terminal and a second terminal, wherein the first terminals of the first driving switch and of the second driving switch are both coupled to the first voltage node, the second terminals of the first driving switch and of the second driving switch are both coupled to the driving terminal, and the first driving switch and the second driving switch are turned on and off under the control of a control signal;
a third driving switch and a fourth driving switch with each driving switch having a first terminal and a second terminal, wherein the first terminals of the third driving switch and of the fourth driving switch are both coupled to the second voltage node, the second terminals of the third driving switch and of the fourth driving switch are both coupled to the driving terminal, and the third driving switch and the fourth driving switch are turned on and off under the control of the control signal; and
a fifth driving switch having a first terminal and a second terminal, wherein the first terminal of the fifth driving switch is coupled to the second terminal of the first driving switch, the second terminal of the fifth driving switch is coupled to the driving terminal, and the fifth driving switch is turned on and off under the control of a first clock signal.

5. The driving circuit as claimed in claim 4, wherein the driving circuit further comprises a sixth driving switch having a first terminal and a second terminal, wherein the first terminal of the sixth driving switch is coupled to the second terminal of the third driving switch, the second terminal of the sixth driving switch is coupled to the driving terminal, and the sixth driving switch is turned on and off under the control of a second clock signal.

6. The driving circuit as claimed in claim 4, wherein the first clock signal has a clock period comprising a first clock time interval and a second clock time interval, and the fifth driving switch is turned on by the first clock signal during the first clock time interval and is turned off by the first clock signal during the second clock time interval, and wherein the length of the driving period is smaller than both the length of the first clock time interval and the length of the second clock time interval.

7. The driving circuit as claimed in claim 4, wherein the first driving switch, the second driving switch and the fifth driving switch are metal oxide semiconductor field effect transistors having a first conductivity type, and the third driving switch and the fourth driving switch are oxide semiconductor field effect transistors having a second conductivity type opposite to the first conductivity type.

8. The driving circuit as claimed in claim 4, wherein the control signal and the driving signal have the same period and the same phase.

9. The driving circuit as claimed in claim 4, wherein the resistance of the first equivalent on resistor depends on whether the first driving switch is turned on or off, whether the second driving switch is turned on or off, and whether the fifth driving switch is turned on or off.

10. The driving circuit as claimed in claim 1, wherein the switching mode power supply comprises an inductor having a first terminal and a second terminal, the at least one power switch comprises a first power switch and a second power switch with each power switch having a first terminal and a second terminal, wherein the first terminal of the second power switch is coupled to the second terminal of the first power switch, the second terminal of the second power switch is coupled to the second voltage node, the second terminal of the first power switch and the first terminal of the second power switch are both coupled to the first terminal of the inductor, and wherein the switching mode power supply is configured to convert the voltage at the first terminal of the first power switch to the voltage at the second terminal of the inductor or to convert the voltage at the second terminal of the inductor to the voltage at the first terminal of the first power switch.

11. A driving method for driving a power switch of a switching mode power supply, wherein the switching mode power supply is configured to convert a voltage by turning the power switch on and off, the driving method comprising providing a driving signal to control the power switch on and off, wherein the driving signal has a plurality of driving periods, each driving period having a rising edge and a falling edge, the power switch is switched on and off during each driving period, and the rising edge has a rising transition period and the falling edge has a falling transition period, and wherein the rising transition period of a first driving period is not equal to the rising transition period of a second driving period, or the falling transition period of the first driving period is not equal to the falling transition period of the second driving period;
wherein the first driving period is within a first clock time interval and the second driving period is within a second clock time interval, the driving signal has a plurality of driving periods during the first clock time interval and has a plurality of driving periods during the second clock time interval, and 1) the rising transition period during the first clock time interval is different from the rising transition period during the second clock time interval; or 2) the falling transition period during the first clock time interval and is different from the falling transition period during the second clock time interval.

12. The driving method as claimed in claim 11, wherein the power switch is applied in a buck converter, a boost converter, a bidirectional converter, a buck-boost converter or a flyback converter.

* * * * *